(12) United States Patent
Ohara

(10) Patent No.: US 11,309,377 B2
(45) Date of Patent: Apr. 19, 2022

(54) PIXEL CIRCUIT AND DISPLAY DEVICE

(71) Applicant: JOLED INC., Tokyo (JP)

(72) Inventor: Masanori Ohara, Tokyo (JP)

(73) Assignee: JOLED INC., Tokyo (JP)

(*) Notice: Subject to any disclaimer, the term of this patent is extended or adjusted under 35 U.S.C. 154(b) by 294 days.

(21) Appl. No.: 16/751,809

(22) Filed: Jan. 24, 2020

(65) Prior Publication Data
US 2020/0251548 A1 Aug. 6, 2020

(30) Foreign Application Priority Data

Feb. 1, 2019 (JP) .............................. JP2019-017070
Sep. 24, 2019 (JP) .............................. JP2019-172968

(51) Int. Cl.
*H01L 27/32* (2006.01)
*G09G 3/3208* (2016.01)
*H01L 27/118* (2006.01)
*H01L 27/12* (2006.01)

(52) U.S. Cl.
CPC ....... *H01L 27/3276* (2013.01); *G09G 3/3208* (2013.01); *H01L 27/3218* (2013.01); *H01L 27/1248* (2013.01); *H01L 2027/11881* (2013.01)

(58) Field of Classification Search
CPC ............ H01L 27/3276; H01L 27/3218; H01L 27/1248; H01L 2027/11881; H01L 27/3279; G09G 3/3208; G09G 2300/0426; G09G 2310/0235; G09G 2310/08; G09G 2320/0223; G09G 2330/02; G09G 3/3258
See application file for complete search history.

(56) References Cited

U.S. PATENT DOCUMENTS

2007/0029929 A1   2/2007   Nakamura et al.

FOREIGN PATENT DOCUMENTS

JP    2007-073499 A    3/2007

*Primary Examiner* — Donald L Raleigh
(74) *Attorney, Agent, or Firm* — Greenblum & Bernstein, P.L.C.

(57) ABSTRACT

A pixel circuit disposed in a pixel region including three subpixel regions includes: three light-emitting elements that are disposed in the subpixel regions and have mutually different luminescent colors; one drive circuit that is disposed in a subpixel region serving as a first subpixel region, and supplies drive current to the three light-emitting elements in time division; and a positive power supply line serving as a first power supply line that is disposed in a subpixel region serving as a second subpixel region, and supplies power supply voltage to the drive circuit.

10 Claims, 14 Drawing Sheets

PIXEL CIRCUIT AND DISPLAY DEVICE

CROSS REFERENCE TO RELATED APPLICATIONS

The present application is based on and claims priority of Japanese Patent Application No. 2019-017070 filed on Feb. 1, 2019 and Japanese Patent Application No. 2019-172968 filed on Sep. 24, 2019. The entire disclosures of the above-identified applications, including the specifications, drawings and claims are incorporated herein by reference in their entirety.

FIELD

The present disclosure relates to a pixel circuit and a display device.

BACKGROUND

Conventionally, an active matrix type color display device (hereinafter referred to as a color display device) using organic EL (Electro-Luminescence) elements has been put into practical use (see, for example, Patent Literature (PTL) 1). The color display device is constructed by arranging in a matrix a plurality of pixel circuits each composed of three subpixel circuits mounting respective organic EL elements each having a luminescent color of red (R), green (G), or blue (B). The color display device displays a color image by controlling light emission luminance for each subpixel circuit.

CITATION LIST

Patent Literature

PTL 1: Japanese Unexamined Patent Application Publication No. 2007-73499

SUMMARY

Technical Problem

In conventional color display devices, there are cases where deterioration in display quality or reduction in power efficiency due to a voltage drop in power supply wiring is a problem.

An object of the present disclosure is to provide a pixel circuit and a display device in which a voltage drop in power supply wiring is small.

Solution to Problem

In order to achieve the aforementioned object, a pixel circuit according to an aspect disclosed herein is pixel circuit disposed in a pixel region including three subpixel regions, and includes: three light-emitting elements that are disposed in mutually different subpixel regions among the three subpixel regions and have mutually different luminescent colors; one drive circuit that is disposed in a first subpixel region and supplies drive current to the three light-emitting elements in time division, the first subpixel region being any one subpixel region among the three subpixel regions; and at least one first power supply line that is disposed in a second subpixel region and supplies power supply voltage to the one drive circuit, the second subpixel region being at least one subpixel region different from the first subpixel region among the three subpixel regions.

Furthermore, a display device according to an aspect disclosed herein includes: a plurality of pixel circuits which are disposed in a matrix and each of which is the above-described pixel circuit; a column power supply line provided in each of columns of the matrix by connection of first power supply lines of pixel circuits disposed in the column among the plurality of pixel circuits; and a surface electrode which is provided over an entirety of the matrix by connection of blanket electrodes of the plurality of pixel circuits disposed in the matrix.

Advantageous Effects

A pixel circuit according to the present disclosure is capable of providing a pixel circuit and a display device in which a voltage drop in power supply wiring is small.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS (Underlying Knowledge Forming the Basis of the Present Disclosure)

The inventor discovered that a voltage drop in power supply wiring in conventional color display devices is caused by the following factors. Before describing embodiments of the present disclosure, the voltage drop occurring in the power supply wiring in the color display devices will be described using an example of a typical organic EL display device.

Figure 1:
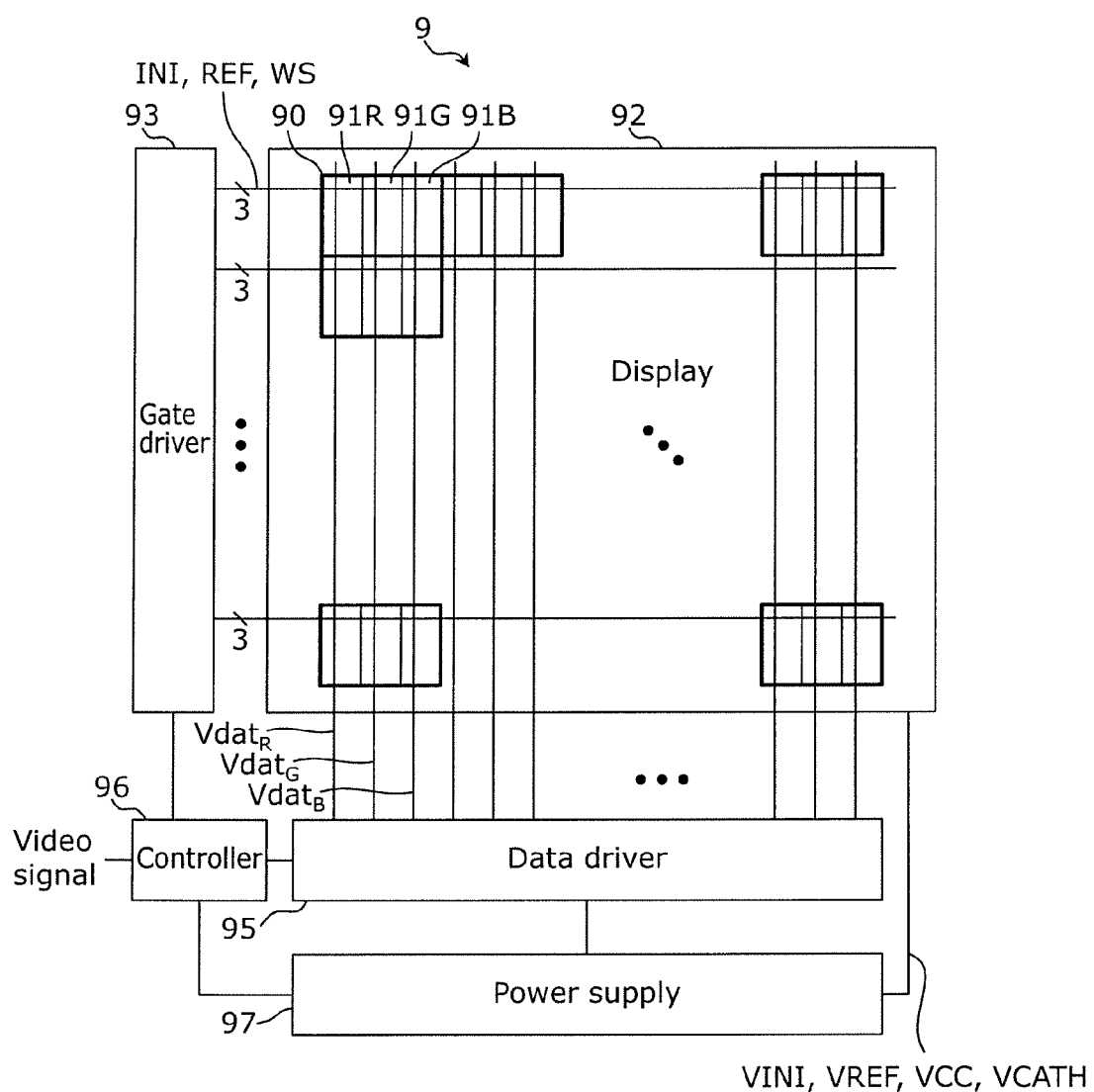
FIG. 1 is a block diagram illustrating an example of the functional configuration of a typical organic EL display device.

FIG. 1 is a block diagram illustrating an example of the functional configuration of a typical organic EL display device (hereinafter referred to as a display device). In the following description, a signal and a wiring that transmits the signal may be referred to by the same reference sign for the sake of brevity. In addition, a circuit and a region where the circuit is formed may be referred to by the same reference sign.

As Illustrated in FIG. 1, display device 9 includes display 92, gate driver 93, data driver 95, controller 96, and power supply 97.

Display 92 has a plurality of pixel circuits 90 disposed in a matrix. Each pixel circuit 90 is composed of subpixel circuits 91R, 91G, and 91B corresponding to luminescent colors of R, G, and B, respectively.

Each row of the matrix is provided with three control signal lines INI, REF, and WS connected to a plurality of pixel circuits 90 disposed in the same row. Control signal lines INI, REF, and WS transmit control signals INI, REF, and WS supplied from gate driver 93 to pixel circuits 90. Note that the number of control signal lines and the control signals are examples, and are not limited to this example.

Each column of the matrix is provided with three data signal lines $Vdat_R$, $Vdat_G$, and $Vdat_B$ connected to a plurality of pixel circuits 90 disposed in the same column. Data signal lines $Vdat_R$, $Vdat_G$, and $Vdat_B$ transmit data signals $Vdat_R$, $Vdat_G$, and $Vdat_B$ related to light emission luminance of R, G, and B supplied from data driver 95 to pixel circuits 90, respectively.

Controller 96 receives a video signal from the outside and supplies control signals for displaying an image of each frame of the video signal at display 92 to gate driver 93 and data driver 95.

Power supply 97 supplies a reference voltage and a power supply voltage to display 92, gate driver 93, data driver 95, and controller 96. For example, power supply 97 supplies reference voltages VINI and VREF, positive power supply voltage VCC, and negative power supply voltage VCATH to display 92.

Figure 2:
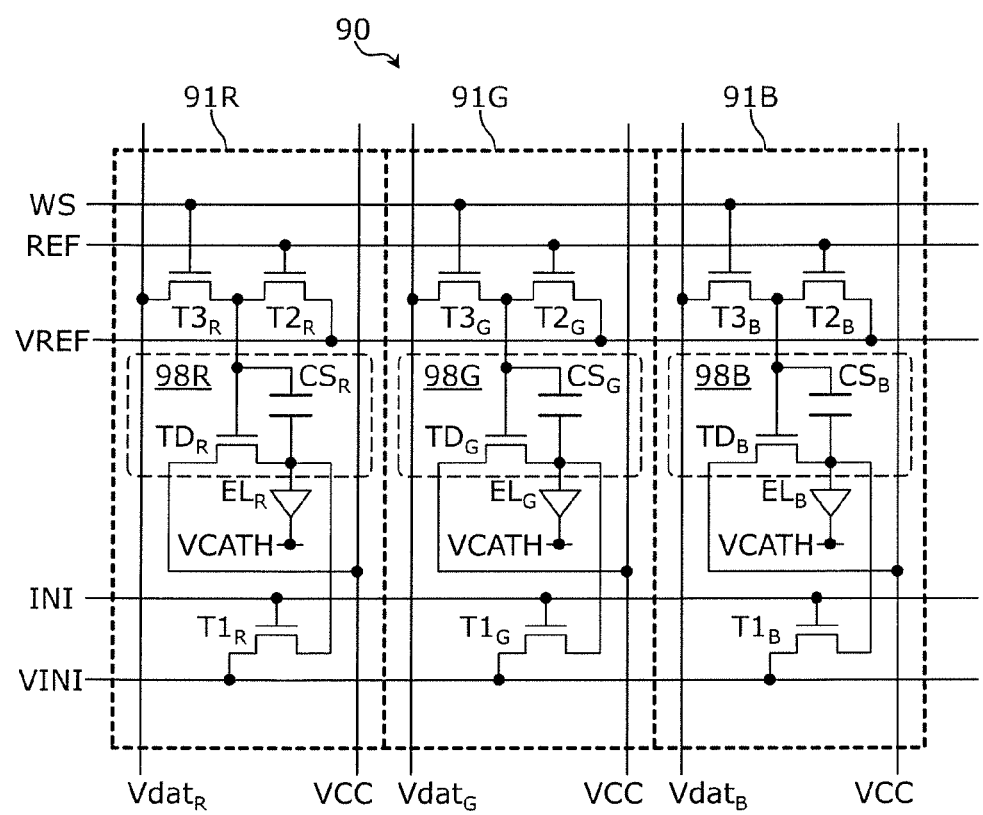
FIG. 2 is a circuit diagram illustrating an example of the configuration of a typical pixel circuit.

FIG. 2 is a circuit diagram illustrating an example of the configuration of pixel circuit 90. As illustrated in FIG. 2, subpixel circuits 91R, 91G, and 91B constituting pixel circuit 90 have the same configuration as each other. The configuration of pixel circuit 90 will be described below focusing attention on subpixel circuit 91R.

Subpixel circuit 91R includes initialization transistor $T1_R$, compensation transistor $T2_R$, write transistor $T3_R$, holding capacitance $CS_R$, drive transistor $TD_R$, and light-emitting element $EL_R$. Subpixel circuit 91R also includes control signal lines INI, REF, and WS, reference voltage lines VINI and VREF, data signal line $Vdat_R$, positive power supply line VCC, and negative power supply line VCATH.

Holding capacitance $CS_R$ and drive transistor $TD_R$ constitute drive circuit 98R. Initialization transistor $T1_R$, compensation transistor $T2_R$, and write transistor $T3_R$ may be included in drive circuit 98R.

Initialization transistor $T1_R$ is turned on according to control signal INI to set a source node of drive transistor $TD_R$ to reference voltage VINI.

Compensation transistor $T2_R$ is turned on according to control signal REF to set a gate node of drive transistor $TD_R$ to reference voltage Vref.

Write transistor $T3_R$ is turned on according to control signal WS to hold the voltage of data signal $Vdat_R$ in holding capacitance $CS_R$.

Drive transistor $TD_R$ supplies current to light-emitting element $EL_R$ according to the voltage held in holding capacitance $CS_R$. Thereby, light-emitting element $EL_R$ emits light with a luminance represented by data signal $Vdat_R$.

Subpixel circuits 91G and 91B are also constituted in the same way as subpixel circuit 91R.

Therefore, in subpixel circuits 91R, 91G, and 91B, data signals $Vdat_R$, $Vdat_G$, and $Vdat_B$ are held at the same timing according to the same control signals INI, REF, and WS, and light-emitting elements $EL_R$, $EL_G$, and $EL_B$ emit light with the luminance corresponding to the held data signals.

Figure 3A:
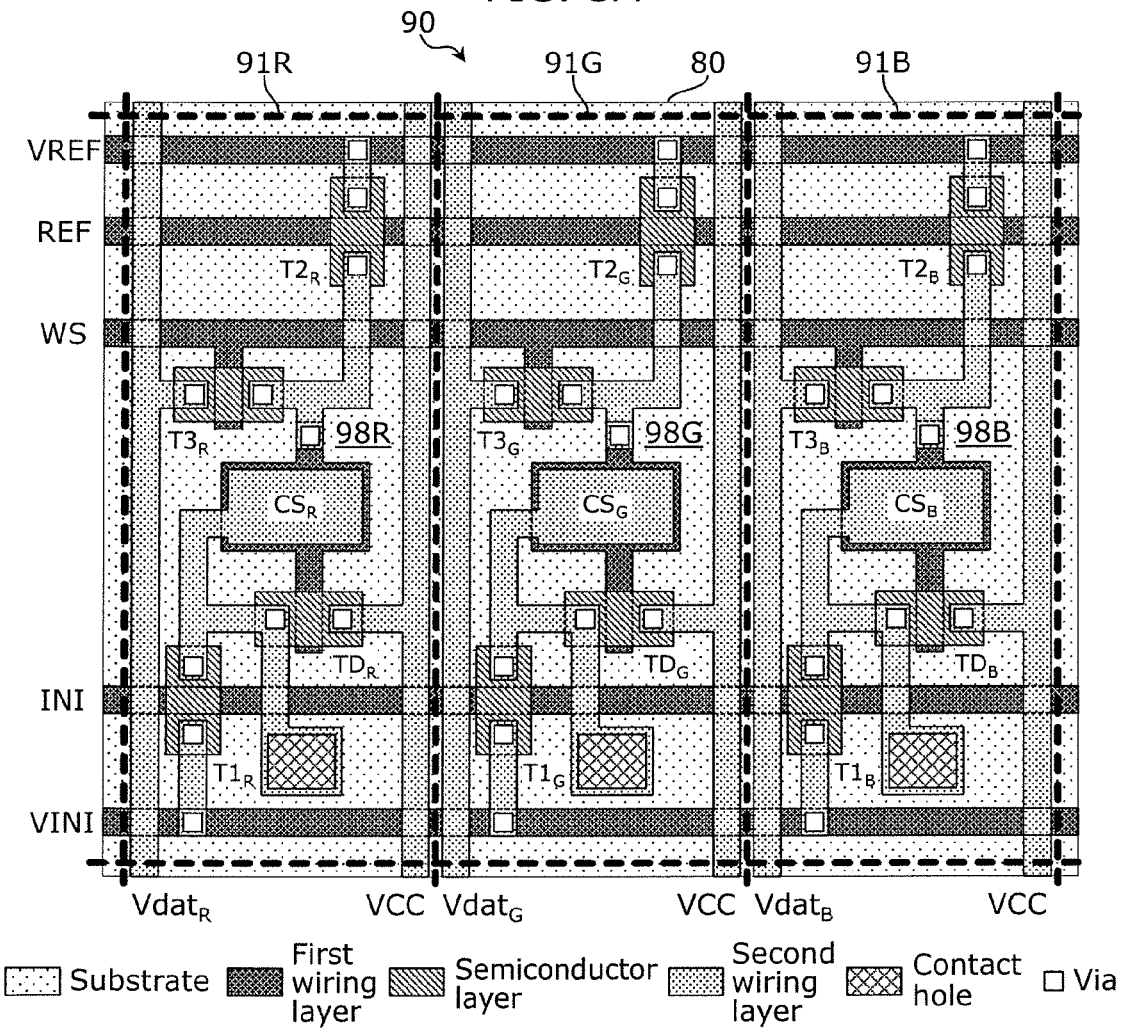
FIG. 3A is a plan view schematically illustrating an example of the structure of a typical pixel circuit.

FIG. 3A is a plan view schematically illustrating an example of the planar structure of pixel circuit 90.

As illustrated in FIG. 3A, subpixel circuits 91R, 91G, and 91B are formed in three subpixel regions 91R, 91G, and 91B Into which pixel region 90 is divided, respectively.

Pixel circuit 90 is formed of, for example, a first wiring layer, a semiconductor layer, and a second wiring layer disposed on substrate 80 in this order. The first wiring layer is mainly used as control signal lines INI, REF, and WS, reference voltage lines VINI and VREF, one electrode of each of holding capacitances $CS_R$, $CS_G$, and $CS_B$, and a gate electrode of each transistor. The semiconductor layer is used as a channel region of each transistor. The second wiring layer is mainly used as data signal lines $Vdat_R$, $Vdat_G$, and $Vdat_B$, positive power supply line VCC, the other electrode of each of holding capacitances $CS_R$, $CS_G$, and $CS_B$, and a source electrode and a drain electrode of each transistor. Different layers are connected with each other through a via.

Figure 3B:
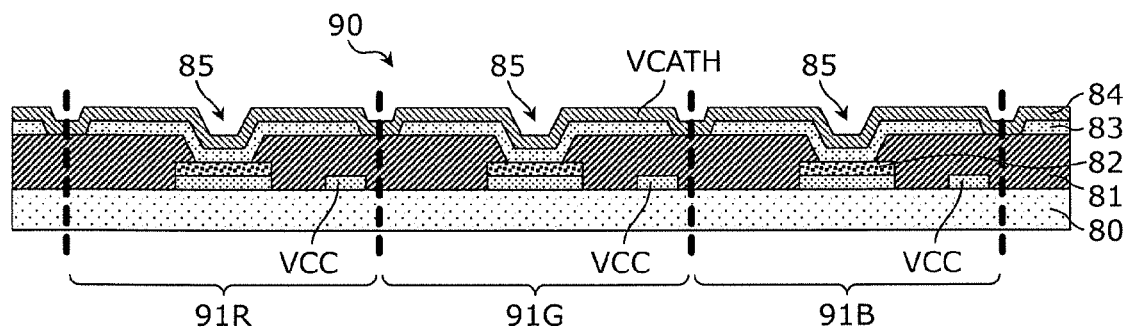
FIG. 3B is a cross-sectional view schematically illustrating an example of the structure of a typical pixel circuit.

FIG. 3B is a cross-sectional view schematically illustrating an example of the cross-sectional structure of pixel circuit 90.

As illustrated in FIG. 3B, pixel circuit 90 is provided with insulating layer 81 to cover substrate 80, the first wiring layer, the semiconductor layer, and the second wiring layer, and on insulating layer 81, anode 82, light-emitting layer 83 containing an organic electro-luminescence material, and cathode 84 which is a transparent electrode are formed in this order. Light-emitting elements $EL_R$, $EL_G$, and $EL_B$ are composed of anode 82, light-emitting layer 83, and cathode 84.

Anodes 82 of light-emitting elements $EL_R$, $EL_G$, and $EL_B$ are connected to the source electrodes of drive transistors $TD_R$, $TD_G$, and $TD_B$ at contact holes 85 opened in insulating layer 81, respectively.

Cathodes 84 of light-emitting elements $EL_R$, $EL_G$, and $EL_B$ constitute negative power supply line VCATH that is one sheet of transparent planar electrode connected over the entirety of display 92. Negative power supply line VCATH is connected to power supply 97 on the outer peripheral end of display 92.

Drive current supplied from drive transistors $TD_R$, $TD_G$, and $TD_B$ to anodes 82 of light-emitting elements $EL_R$, $EL_G$, and $EL_B$ causes light-emitting layers 83 of light-emitting elements $EL_R$, $EL_G$, and $EL_B$ to emit light and flows through negative power supply line VCATH (cathode 84) to return to power supply 97.

In pixel circuit 90 formed as describe above, drive circuits 98R, 98G, and 98B are provided in subpixel circuits 91R, 91G, and 91B, respectively, and are laid out at a high density. Therefore, positive power supply line VCC cannot have a wide wiring width and tends to have a high resistance. In addition, since negative power supply line VCATH is composed of a planar transparent electrode, resistance is also likely to be high due to limitations of material and film thickness. That is, in pixel circuit 90, the resistance of the power supply wiring is high so that a voltage drop in the power supply wiring is likely to occur.

Hereinafter, embodiments of the present disclosure will be described in detail with reference to drawings. Note that the embodiments described below all show comprehensive or specific examples. Numerical values, shapes, materials, components, arrangements and connection forms of components, and the like indicated in the following embodiments are examples, and do not intend to limit the present disclosure.

Embodiment 1

A pixel circuit and a display device according to Embodiment 1 will be described.

The pixel circuit according to the embodiment causes a plurality of light-emitting elements with mutually different luminescent colors to sequentially emit light in time division, thereby reduces drive circuits to one per pixel circuit, provides a large power supply wiring in regions where the drive circuits are reduced, and reduces a voltage drop in a power supply wiring.

Figure 4:
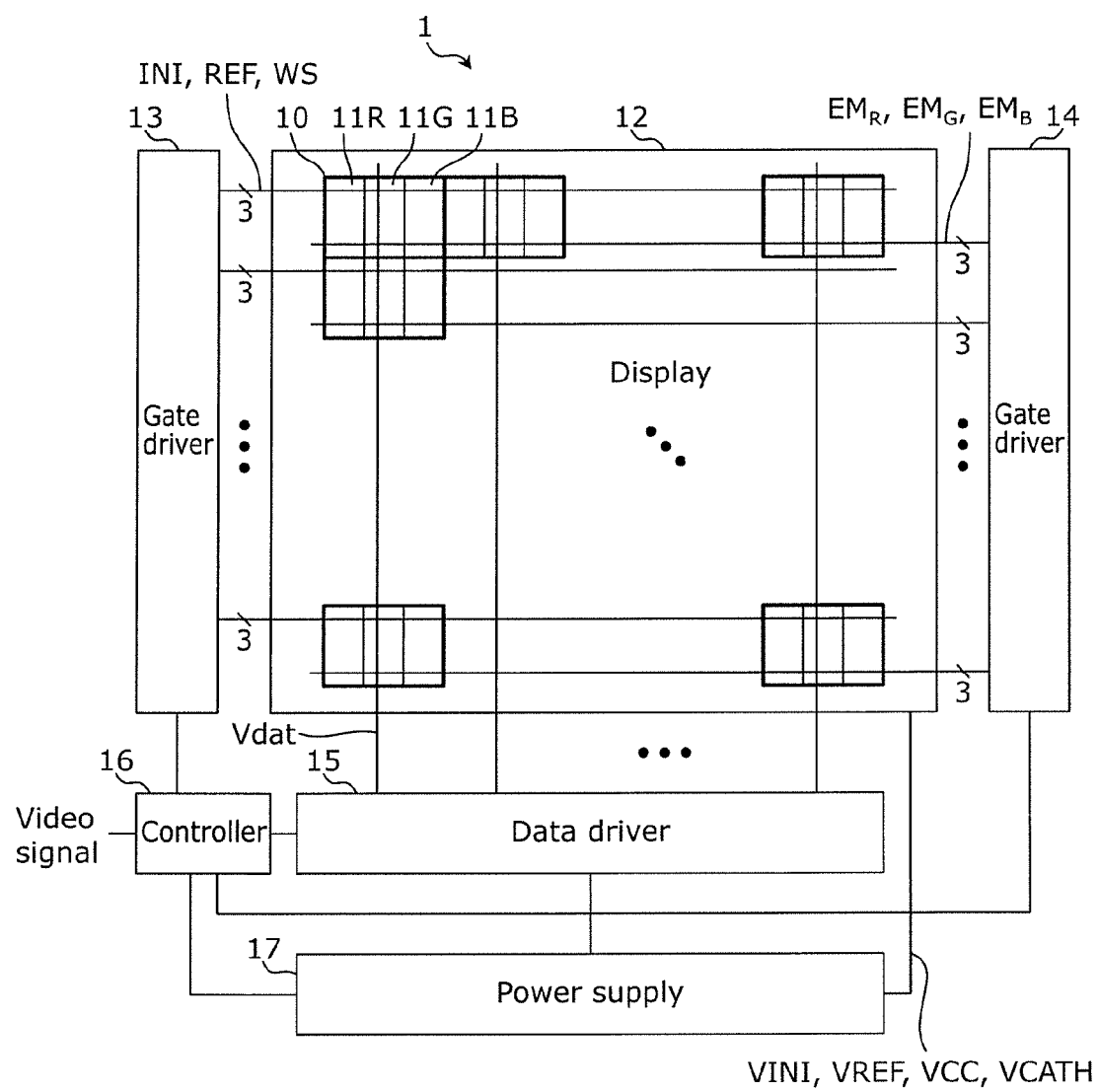
FIG. 4 is a block diagram illustrating an example of the functional configuration of a display device according to Embodiment 1.

FIG. 4 is a block diagram illustrating an example of the functional configuration of display device 1 according to the embodiment. In the following description, a signal and a wiring that transmits the signal may be referred to by the same reference sign for the sake of brevity. In addition, a circuit and a region where the circuit is formed may be referred to by the same reference sign.

As illustrated in FIG. 4, display device 1 includes display 12, gate drivers 13 and 14, data driver 15, controller 16, and power supply 17.

Display 12 has a plurality of pixel circuits 10 disposed in a matrix. Each pixel circuit 10 is formed in a region composed of subpixel regions 11R, 11G, and 11B corresponding to luminescent colors of R, G, and B, respectively.

Each row of the matrix is provided with three control signal lines connected to a plurality of pixel circuits 10 disposed in the same row. The control signal lines transmit control signals INI, REF, and WS supplied from gate driver 13 to pixel circuit 10. Note that the number of control signal lines and the control signals are examples, and are not limited to this example.

Each row of the matrix is provided with three color selection lines connected to the plurality of pixel circuits 10 disposed in the same row. Color selection lines transmit control signals $EM_R$, $EM_G$, and $EM_B$ supplied from gate driver 14 to pixel circuits 10.

Each column of the matrix is provided with one data signal line connected to a plurality of pixel circuits 10 disposed in the same column. The data signal line transmits data signal Vdat related to light emission luminance of R, G, and B supplied from data driver 15 to pixel circuits 10. Data signal Vdat includes data signals related to the light emission luminance of respective luminescent colors of R, G, and B in time division.

Controller 16 receives a video signal from the outside and supplies a control signal for displaying an image of each frame of the video signal at display 12 to gate drivers 13 and 14 and data driver 15.

Power supply 17 supplies a reference voltage and a power supply voltage to display 12, gate drivers 13 and 14, data driver 15, and controller 16. For example, power supply 17 supplies reference voltages VINI and VREF, positive power supply voltage VCC, and negative power supply voltage VCATH to display 12.

Figure 5:
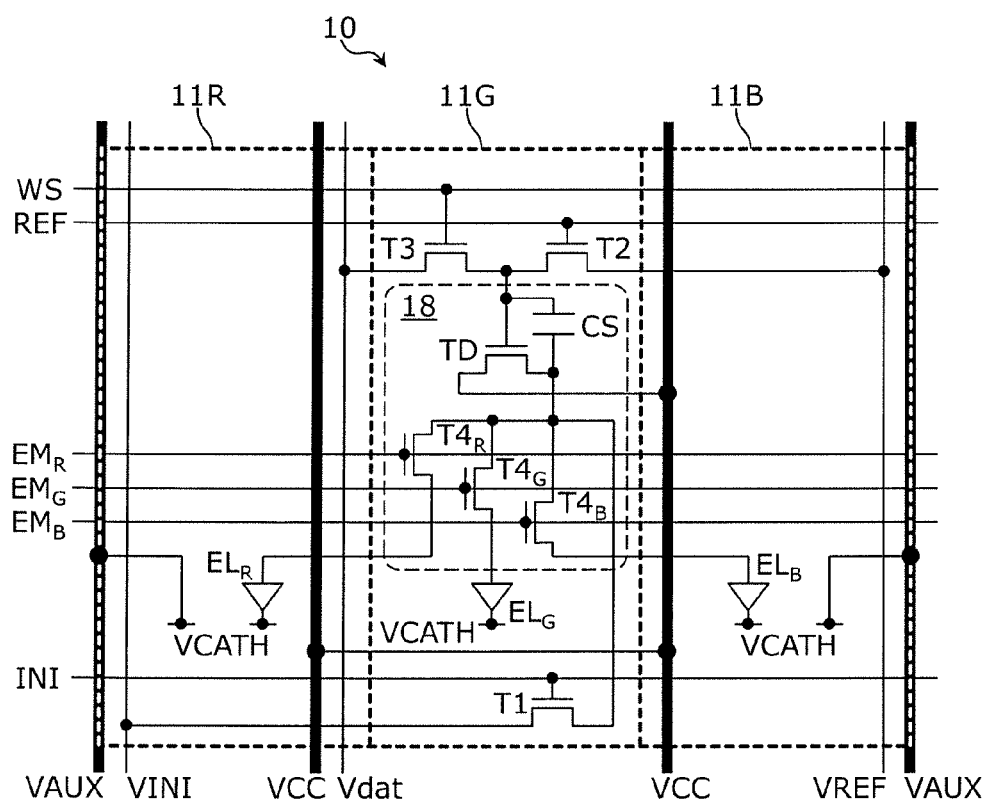
FIG. 5 is a circuit diagram illustrating an example of the configuration of a pixel circuit according to Embodiment 1.

FIG. 5 is a circuit diagram illustrating an example of the configuration of pixel circuit 10. As illustrated in FIG. 5, pixel circuit includes initialization transistor T1, compensation transistor T2, write transistor T3, holding capacitance CS, drive transistor TD, color selection transistors $T4_R$, $T4_G$, and $T4_B$, and light-emitting elements $EL_R$, $EL_G$, and $EL_B$. Pixel circuit 10 also includes control signal lines INI, REF, and WS, reference voltage lines VINI and VREF, color selection lines $EM_R$, $EM_G$, and $EM_B$, data signal line Vdat, positive power supply line VCC, negative power supply line VCATH, and auxiliary power supply line VAUX.

Holding capacitance CS, drive transistor TD, and color selection transistors $T4_R$, $T4_G$, and $T4_B$ constitute drive circuit 18. Initialization transistor T1, compensation transistor T2, and write transistor T3 may be included in drive circuit 18.

Initialization transistor T1 is turned on according to control signal INI to set a source node of drive transistor TD to reference voltage VINI.

Compensation transistor T2 is turned on according to control signal REF to set a gate node of drive transistor TD to reference voltage Vref.

Write transistor T3 is turned on according to control signal WS to hold the voltage of data signal Vdat in holding capacitance CS.

Drive transistor TD outputs a current of magnitude corresponding to the voltage held in holding capacitance CS.

Color selection transistors $T4_R$, $T4_G$, and $T4_B$ are alternatively turned on according to control signals $EM_R$, $EM_G$, and $EM_B$ and supply the current output from drive transistor TD to light-emitting element $EL_R$, $EL_G$, or $EL_B$. Thereby, light-emitting element $EL_R$, $EL_G$, or $EL_B$ emits light at a luminance represented by data signal Vdat.

Figure 6A:
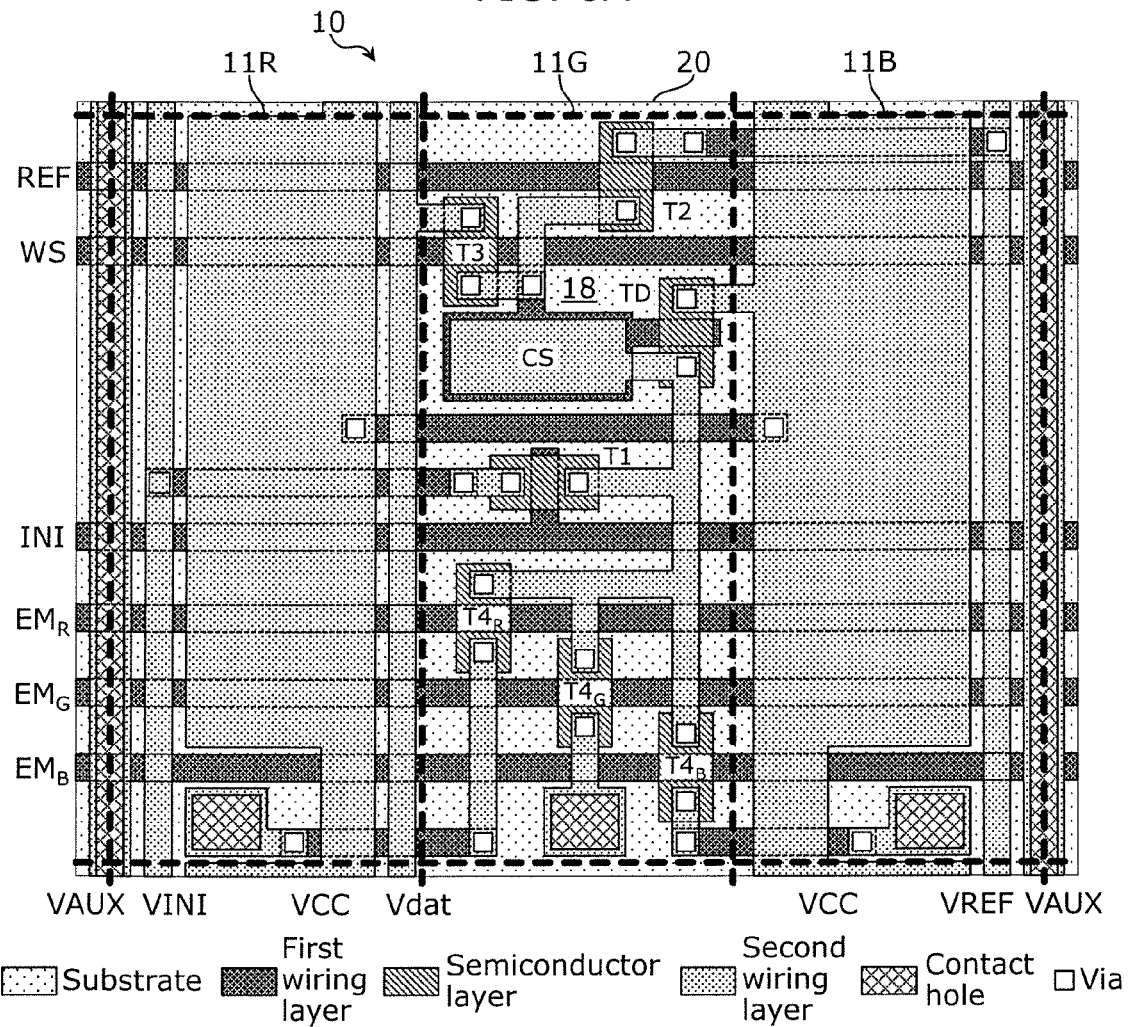
FIG. 6A is a plan view schematically illustrating an example of the structure of a pixel circuit according to Embodiment 1.

FIG. 6A is a plan view schematically illustrating an example of the planar structure of pixel circuit 10. As illustrated in FIG. 6A, pixel circuit 10 is formed in a pixel region divided into three subpixel regions 11R, 11G, and 11B.

Pixel circuit 10 is formed of, for example, a first wiring layer, a semiconductor layer, and a second wiring layer disposed on substrate in this order. The first wiring layer is mainly used as control signal lines INI, REF, WS, $EM_R$, $EM_G$, and $EM_B$, one electrode of holding capacitance CS, and a gate electrode of each transistor. The semiconductor layer is used as a channel region of each transistor. The second wiring layer is mainly used as data signal line Vdat, reference voltage lines VINI and VREF, positive power supply line VCC, auxiliary power supply line VAUX, the other electrode of holding capacitance CS, and a source electrode and a drain electrode of each transistor. Different layers are connected with each other with a via.

Light-emitting elements $EL_R$, $EL_G$, and $EL_a$ are disposed in subpixel regions 11R, 11G, and 11B, respectively, and drive circuit 18 including holding capacitance CS, drive transistor TD, and color selection transistors $T4_R$, $T4_G$, and $T4_B$ is disposed in subpixel region 11G. Data signal line Vdat is disposed in subpixel region 11R. Positive power supply line VCC and auxiliary power supply line VAUX are disposed in subpixel regions 11R and 11B.

Positive power supply line VCC and auxiliary power supply line VAUX are provided in contact with opposite two sides (upper side and lower side in the example of FIG. 6A) of subpixel regions 11R and 11B, and are connected with positive power supply lines VCC and auxiliary power supply lines VAUX of pixel circuits 10 adjacent upward and downward, respectively. Positive power supply line VCC may occupy at least half of an area of subpixel regions 11R and 11B in plan view.

Figure 6B:
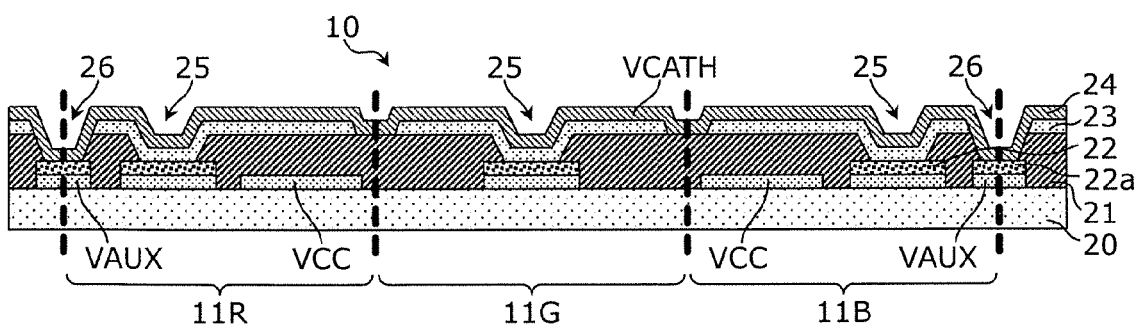
FIG. 6B is a cross-sectional view schematically illustrating an example of the structure of a pixel circuit according to Embodiment 1.

FIG. 6B is a cross-sectional view schematically illustrating an example of the cross-sectional structure of pixel circuit 10.

As illustrated in FIG. 6B, in pixel circuit 10, insulating layer 21 is provided to cover substrate 20, the first wiring layer, the semiconductor layer, the second wiring layer, and anode 22, and on insulating layer 21, light-emitting layer 23 containing an organic electro-luminescence material, and cathode 24 which is a transparent electrode are formed in this order. Light-emitting elements $EL_R$, $EL_G$, and $EL_B$ are composed of anode 22, light-emitting layer 23, and cathode 24.

Anodes 22 of light-emitting elements $EL_R$, $EL_G$, and $EL_B$ are connected to the source electrodes (second wiring layer) of drive transistors $TD_R$, $TD_G$, and $TD_e$ at contact holes 25 opened in insulating layer 21, respectively.

Cathodes 24 of light-emitting elements $EL_R$, $EL_G$, and $EL_B$ constitute negative power supply line VCATH that is one sheet of planar transparent electrode connected over the entirety of display 12. Negative power supply line VCATH is connected to auxiliary power supply line VAUX at contact hole 26 opened in insulating layer 21. In the embodiment, negative power supply line VCATH is connected to auxiliary power supply line VAUX via third power supply line 22a which is formed at the same time as anode 22 and insulated from anode 22, but negative power supply line VCATH may be directly connected to auxiliary power supply line VAUX. Auxiliary power supply line VAUX may be connected to negative power supply line VCATH over the entire length in pixel circuit 10. Negative power supply line VCATH is connected to power supply 17 on the outer peripheral end of display 12.

Current supplied from drive transistors $TD_R$, $TD_G$, and $TD_B$ to anodes 22 of light-emitting elements $EL_R$, $EL_G$, and $EL_B$ causes light-emitting layers 23 of light-emitting elements $EL_R$, $EL_G$, and $EL_B$ to emit light and flows through negative power supply line VCATH (cathode 24) and auxiliary power supply line VAUX to return to power supply 17.

In the above-described description and the later-described embodiments, positive power supply line VCC is an example of a first power supply line, cathode 24 (and negative power supply line VCATH) is an example of a blanket electrode, and auxiliary power supply line VAUX is an example of a second power supply line.

Subpixel region 11G where drive circuit 18 is disposed is an example of a first subpixel region. Subpixel regions 11R and 11B where positive power supply line VCC is disposed are an example of a second subpixel region. Subpixel regions 11R and 11B where auxiliary power supply line VAUX is disposed are an example of a third subpixel region.

Next, methods for driving pixel circuit 10 and display device 1 will be described.

Figure 7A:
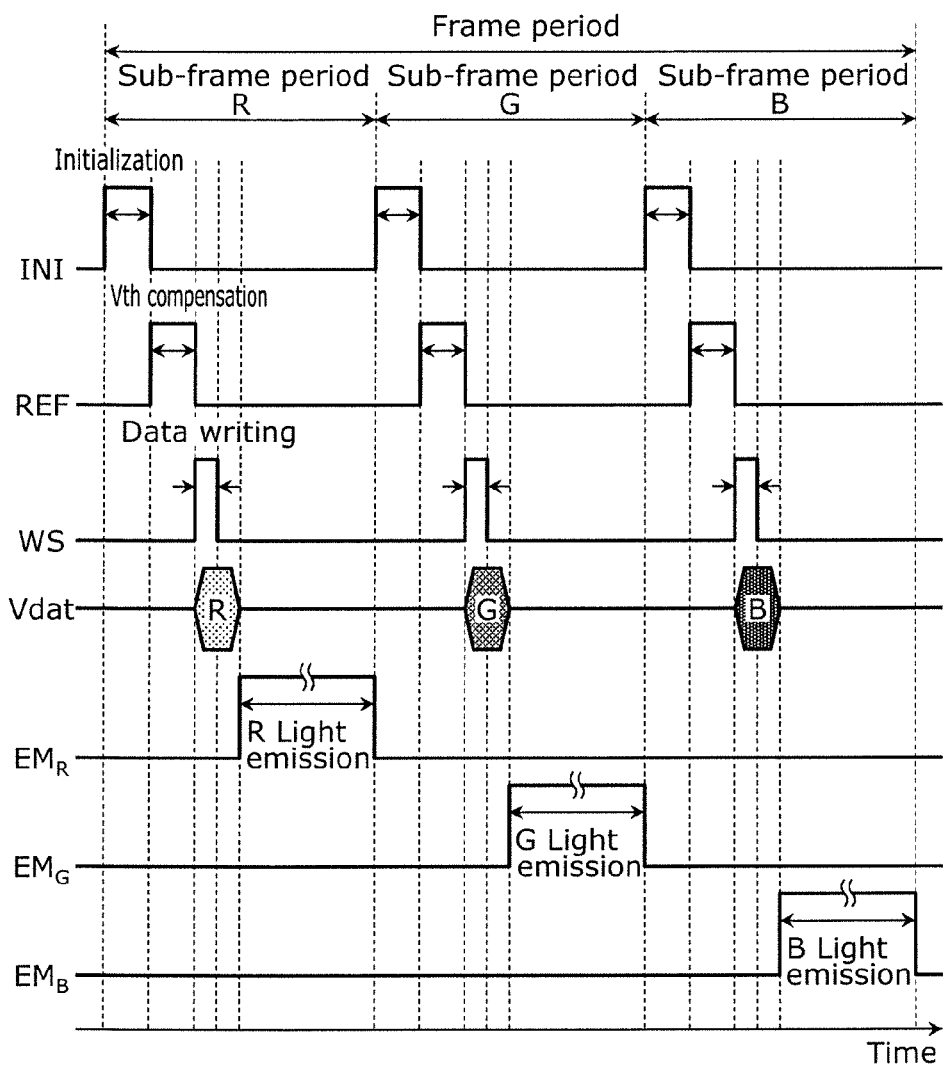
FIG. 7A is a timing chart illustrating an example of the method for driving a pixel circuit according to Embodiment 1.

FIG. 7A is a timing chart illustrating an example of the method for driving pixel circuit 10. As illustrated in FIG. 7A, pixel circuit 10 causes light-emitting elements $EL_R$, $EL_G$, and $EL_B$ of subpixel circuits 11R, 11G, and 11B to sequentially emit light in time division in sub-frame periods R, G, and B which constitute one frame period and correspond to luminescent colors R, G, and B, respectively, and displays a desired color by afterimage effect.

That is, in pixel circuit 10, the following operation is performed in each of sub-frame periods R, G, and B corresponding to luminescent colors R, G, and B, respectively, within one frame period.

Data signal Vdat related to the light emission luminance of luminescent color R, G, or B corresponding to a sub-frame period is held in holding capacitance CS via data signal line Vdat (initialization, Vth compensation, and data write). A current corresponding to data signal Vdat held in holding capacitance CS is output from drive transistor TD. The current output from drive transistor TD is supplied to light-emitting element $EL_R$, $EL_G$, or $EL_B$ of the luminescent color corresponding to the sub-frame period via color selection transistor $T4_R$, $T4_G$, or $T4_B$ different for each sub-frame period (R emission, G emission, or B emission).

Figure 7B:
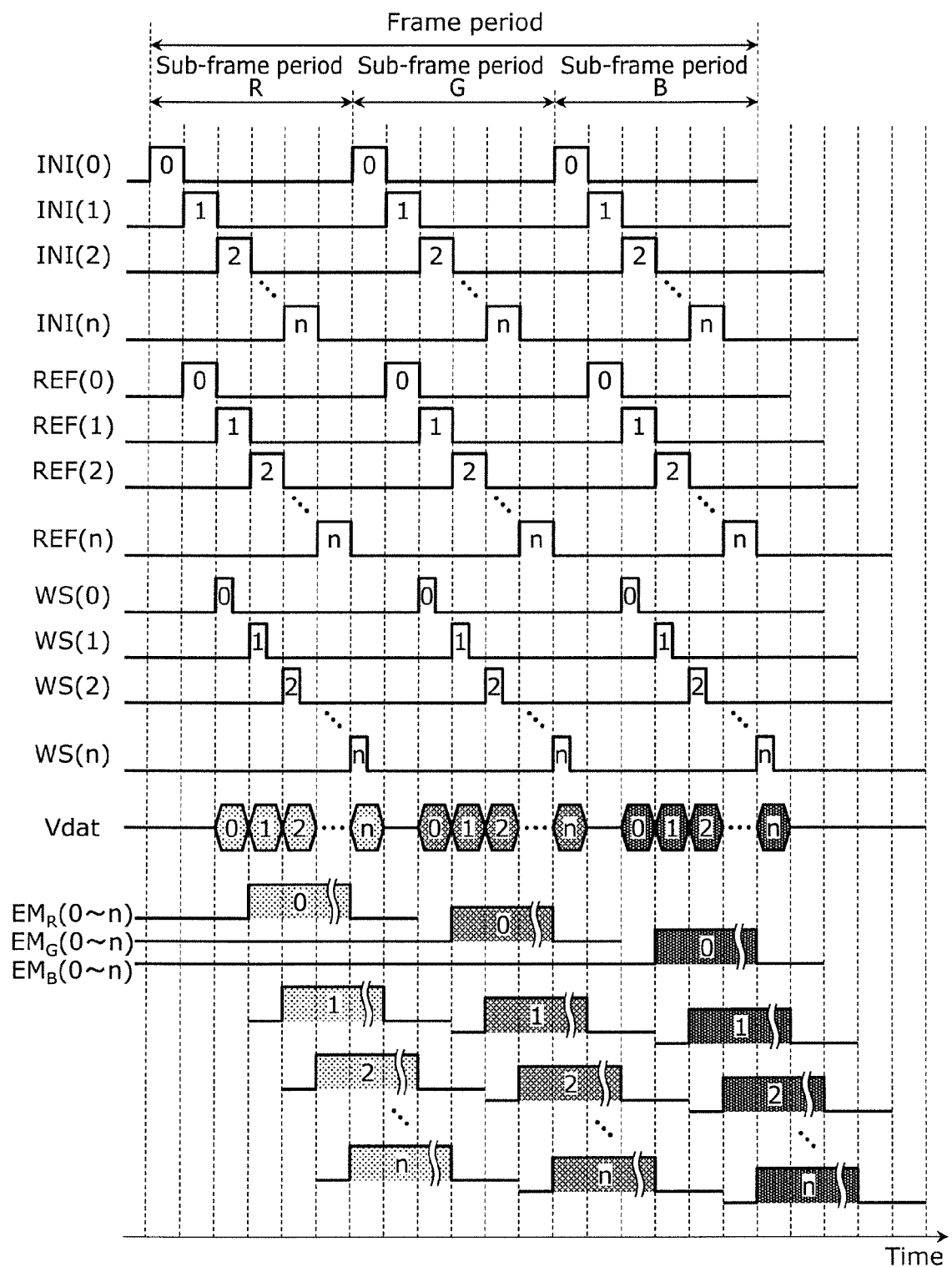
FIG. 7B is a timing chart illustrating an example of the method for driving a display device according to Embodiment 1.

FIG. 7B is a timing chart illustrating an example of the method for driving display device 1. In FIG. 7B, a numerical character in parentheses attached to a signal name indicates a row to which the signal is supplied. As illustrated in FIG. 7B, the operation of pixel circuit 10 illustrated in FIG. 7A is sequentially performed in pixel circuits of all rows 0-n of display device 1.

A voltage drop in the power supply wiring of pixel circuit 10 formed as described above will be described based on comparison with pixel circuit 90.

Pixel circuit 10 displays a desired color by causing light-emitting elements $EL_R$, $EL_G$, and $EL_B$ to sequentially emit light in time division, and thereby reduces drive circuits 98R, 98G, and 98B (see FIG. 2) one of which is conventionally provided for each subpixel circuit to one drive circuit 18 for each pixel circuit. Accordingly, positive power supply line VCC and auxiliary power supply line VAUX connected with negative power supply line VCATH are provided in the subpixel regions where drive circuit 18 is not disposed.

As a result, it becomes easier to provide positive power supply line VCC with a wider width than before, and the resistance of positive power supply line VCC can be lowered. Since the effective resistance of negative power supply line VCATH can be reduced to the combined resistance of negative power supply line VCATH and auxiliary power supply line VAUX, the effective resistance of negative power supply line VCATH can be lowered.

In order to confirm the effect by pixel circuit 10, specific shapes of positive power supply line VCC, negative power supply line VCATH, and auxiliary power supply line VAUX were set, and the voltage drop was evaluated.

Figure 8:
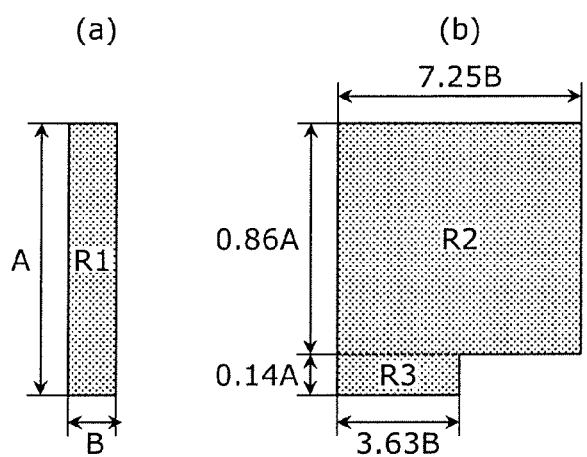
FIG. 8 is a diagram illustrating an example of the planar shape of a positive power supply line used for evaluation of a voltage drop according to Embodiment 1.

FIG. 8 is a plan view illustrating an example of the planar shape of positive power supply line VCC used for the evaluation of the voltage drop, and (a) and (b) show shape examples of positive power supply lines VCC in pixel circuits 90 and 10, respectively.

In (a) in FIG. 8, three positive power supply lines VCC included in pixel circuit 90 in FIG. 3A are together represented by rectangular resistance body R1 having a length of A and a width of B. In (b) in FIG. 8, two positive power supply lines VCC included in pixel circuit in FIG. 6A are together represented by a resistance body in which rectangular resistance body R2 having a length of 0.86A and a width of 7.25B is connected in series with rectangular resistance body R3 having a length of 0.14A and a width of 3.63B.

Assuming that the sheet resistance ρ/□ of resistance bodies R1-R3 is 1 and the resistance value of resistance body R1 is 1 in arbitrary units, the resistance values of resistance bodies R2 and R3 are 0.12 and 0.04, respectively. Consequently, whereas the resistance value of positive power supply line VCC per pixel circuit is 1 (resistance value of resistance body 1) in pixel circuit 90, it is 0.16 (resistance value of series resistance of resistance bodies R2 and R3) in pixel circuit 10, and the resistance value of positive power supply line VCC is reduced to about ⅙.

Here, since pixel circuit 10 displays a desired color by causing light-emitting elements $EL_R$, $EL_G$, and $EL_B$ to sequentially emit light in time division, the emission time of each of light-emitting elements $EL_R$, $EL_G$, and $EL_B$ becomes ⅓ of the emission time in pixel circuit 90. Therefore, in pixel circuit 10, in order to obtain a light emission luminance equivalent to that of pixel circuit 90, it is necessary to cause light-emitting elements $EL_R$, $EL_G$, and $EL_B$ to emit light with a luminance three times the conventional one. In other words, it is necessary to supply a light emission current approximately three times the conventional one to light-emitting elements $EL_R$, $EL_G$, and $EL_B$.

Taking this into consideration, when current in pixel circuits 90 and 10 is 1 and 3 in arbitrary units, respectively, a voltage drop occurring in positive power supply line VCC per pixel circuit is found to be 1 in pixel circuit 90 and 0.48 in pixel circuit 10 in arbitrary units.

From this result, the voltage drop in positive power supply line VCC per pixel circuit in pixel circuit 10 is found to be nearly half that in pixel circuit 90 even if an increase in light emission current due to time division emission is considered.

Figure 9:
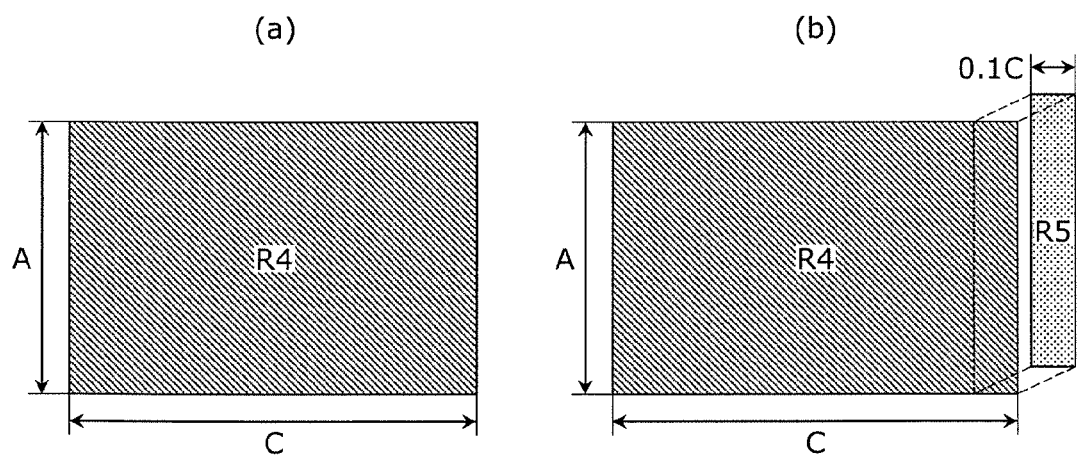
FIG. 9 is diagram illustrating an example of the planar shape of a negative power supply line used for evaluation of a voltage drop according to Embodiment 1.

FIG. 9 is a plan view illustrating an example of the planar shape of negative power supply line VCATH used for the evaluation of the voltage drop, and (a) illustrates a shape example of negative power supply line VCATH in pixel circuit 90 and (b) illustrates a shape example of negative power supply line VCATH and auxiliary power supply line VAUX in pixel circuit 10.

In (a) in FIG. 9, negative power supply line VCATH in pixel circuit 90 in FIG. 3A is represented by rectangular resistance body R4 having a length of A and a width of C. In (b) in FIG. 9, negative power supply line VCATH and auxiliary power supply line VAUX in pixel circuit 10 in FIG. 6A are together represented by a resistance body in which rectangular resistance body R4 having a length of A and a width of C is connected with rectangular resistance body R5 having a length of A and a width of 0.1C. Here, it is assumed that auxiliary power supply line VAUX (resistance body R5) is connected with negative power supply line VCATH (resistance body R4) over the entire length.

Assuming that the sheet resistance p/o of resistance bodies R4 and R5 is 50 and 10, respectively, and the resistance value of resistance body R5 is 50 in arbitrary units, the resistance value of resistance body R4 is 10. Consequently, whereas the resistance value of negative power supply line VCATH per pixel circuit is 50 (resistance value of resistance body R4) in pixel circuit 90, it is 8.3 (resistance value of parallel resistance of resistance bodies R4 and R5) in pixel circuit 10, and the resistance value of negative power supply line VCATH is reduced to about ⅙.

Assuming that current in pixel circuits 90 and 10 is 1 and 3 in arbitrary units, respectively, a voltage drop occurring in negative power supply line VCATH per pixel circuit is found to be 50 in pixel circuit 90 and 24.9 in pixel circuit 10 in arbitrary units.

From this result, the voltage drop in negative power supply line VCATH per pixel circuit in pixel circuit 10 is found to be nearly half that in pixel circuit 90 even if an increase in light emission current due to time division emission is considered.

Embodiment 2

A pixel circuit according to Embodiment 2 will be described. The pixel circuit according to the embodiment is different from the pixel circuit according to Embodiment 1 In the connection aspect between negative power supply line VCATH and auxiliary power supply line VAUX. Hereinafter, the pixel circuit according to the embodiment will be described focusing on the difference from pixel circuit 10 according to Embodiment 1.

First, the planar structure of the pixel circuit according to the embodiment will be described with reference to FIG. 10.

Figure 10:
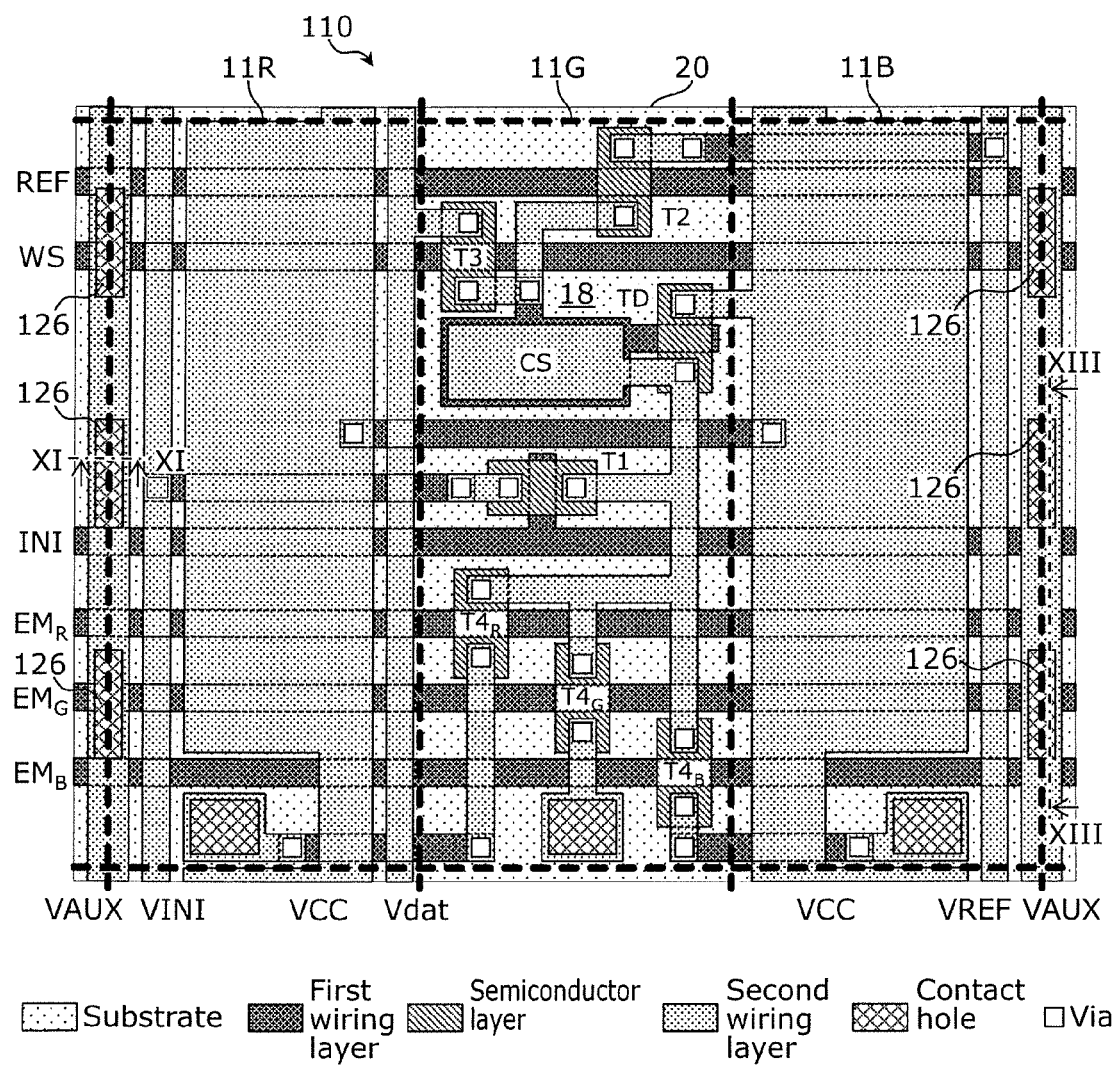
FIG. 10 is a plan view schematically illustrating an example of the planar structure of a pixel circuit according to the Embodiment 2.

FIG. 10 is a plan view schematically illustrating an example of the planar structure of pixel circuit 110 according to the embodiment. In FIG. 10, lower insulating layer 121 that is omitted and not illustrated or described in pixel circuit 10 according to Embodiment 1 is also illustrated. Lower insulating layer 121 is an insulating layer disposed between auxiliary power supply line VAUX and third power supply line 22a.

In pixel circuit 10 according to Embodiment 1, auxiliary power supply line VAUX is provided in contact with the opposite two sides of the third subpixel region and is connected with negative power supply line VCATH over the entire length between the opposite two sides of the third subpixel region. As opposed to this, in pixel circuit 110 according to the embodiment, auxiliary power supply line VAUX is provided in contact with the opposite two sides of the third subpixel region and is connected with negative power supply line VCATH at one or more contact holes 126 between the opposite two sides of the third subpixel region, as illustrated in FIG. 10. Also by such a configuration, in the same manner as pixel circuit 10 according to Embodiment 1, the effective resistance of a blanket electrode within pixel circuit 110 can be effectively reduced and the voltage drop in the blanket electrode can be reduced more reliably.

Figure 11:
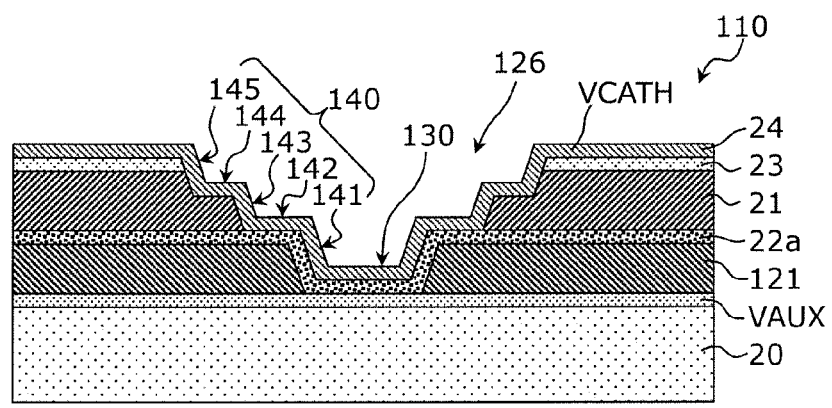
FIG. 11 is a schematic cross-sectional view illustrating an example of the structure of a contact hole formed in a pixel circuit according to the Embodiment 2.

The shape of contact hole 126 according to the embodiment will be described with reference to FIG. 11. FIG. 11 is a schematic cross-sectional view illustrating an example of the structure of contact hole 126 formed in pixel circuit 110 according to the embodiment. FIG. 11 illustrates a cross section taken along line XI-XI in FIG. 10.

As illustrated in FIG. 11, contact holes 126 according to the embodiment each have bottom surface 130 and side surface 140 surrounding the periphery of bottom surface 130, and at least part of side surface 140 of at least one contact hole 126 has a step-like cross-sectional shape including one or more flat portions. Bottom surface 130 is positioned at the bottom portion of contact hole 126 having a concave shape and is in parallel with a main surface of substrate 20. Note that in the following, parallel means not only a completely parallel state but also a substantially parallel state. For example, a state of being shifted from a perfectly parallel state by about a manufacturing error is also referred to as parallel. In addition, a state in which shift from a perfectly parallel state is within about ±5° may be regarded as parallel.

Side surface 140 is a surface corresponding to a side wall of concave contact hole 126. In other words, side surface 140 is a cylindrical surface that connects bottom surface 130 and the outer periphery of contact hole 126. At least part of side surface 140 has one or more inclined portions having surfaces intersecting with bottom surface 130, and one or more flat portions having surfaces parallel to bottom surface 130. In the example illustrated in FIG. 11, side surface 140 has inclined portion 141 in contact with bottom surface 130, flat portion 142 in contact with inclined portion 141, inclined portion 143 in contact with flat portion 142, flat portion 144 in contact with inclined portion 143, and inclined portion 145 in contact with flat portion 144.

Figure 12:
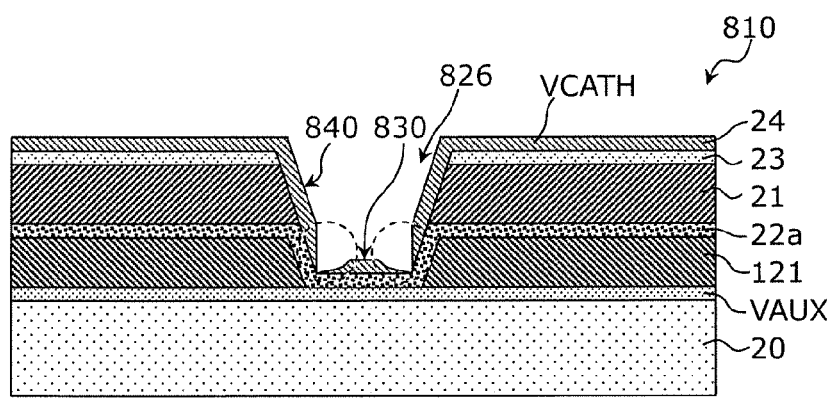
FIG. 12 is a schematic cross-sectional view illustrating the structure of a contact hole formed in a pixel circuit of comparative example 1.

Hereinafter, the effect of contact hole 126 according to the embodiment will be described with reference to FIG. 12 while comparing with the contact hole of comparative example 1. FIG. 12 is a schematic cross-sectional view illustrating the structure of contact hole 826 formed in pixel circuit 810 of comparative example 1. Pixel circuit 810 of comparative example 1 has the same layer configuration as pixel circuit 110 according to the embodiment, but differs from pixel circuit 110 according to the embodiment in the structure of contact hole 826

As illustrated in FIG. 12, contact hole 826 of comparative example 1 has bottom surface 830 and side surface 840 surrounding the periphery of bottom surface 830. Side surface 840 of contact hole 826 of comparative example 1 does not have one or more flat portions. In such contact hole 826, when negative power supply line VCATH (that is, cathode 24) is formed by sputtering, vapor deposition, or the like, it is hard for metal particles that form negative power supply line VCATH to reach a region shadowed by the peripheral part or the like of contact hole 826. Especially, it is hard for metal particles that form negative power supply line VCATH to reach the vicinity of a part where bottom surface 830 is in contact with side surface 840 (regions surrounded by dashed circles in FIG. 12). Therefore, in the vicinity of the part where bottom surface 830 is in contact with side surface 840, the film thickness of negative power supply line VCATH may become thin, or an unformed part (that is, disconnection) may occur. A problem like this becomes especially prominent when the aspect ratio (that is, a ratio of depth to the dimension of the bottom surface) of contact hole 826 is large.

In contrast to this, in contact hole 126 according to the embodiment, side surface 140 has a step-like cross-sectional shape including one or more flat portions 142 and 144. Thereby, the aspect ratio of contact hole 126 can be substantially reduced so that a region of bottom surface 130 shadowed by the periphery or the like of contact hole 126 can be reduced. Consequently, the film thickness of negative power supply line VCATH (that is, cathode 24) becoming thin or an unformed part occurring within contact hole 126 can be reduced.

In the embodiment, as illustrated in FIG. 11, pixel circuit 110 further includes third power supply line 22a which is formed at the same time as anode 22, that is, formed of the same material as anode 22. Auxiliary power supply line VAUX is connected to negative power supply line VCATH via third power supply line 22a on bottom surface 130 of contact hole 126. Negative power supply line VCATH is in contact with third power supply line 22a not only on bottom surface 130 and inclined portion 141 but also on flat portion 142.

In this way, negative power supply line VCATH is in contact with third power supply line 22a not only on inclined portion 141 but also on flat portion 142. By negative power supply line VCATH being in contact with third power supply line 22a in a step-shape in this way, the aspect ratio of contact hole 126 can be substantially reduced. Therefore, when negative power supply line VCATH is formed, it becomes easier for metal particles to reach the entirety of contact hole 126. Since metal particles are likely to deposit on flat portion 142 when negative power supply line VCATH and third power supply line 22a are formed, step disconnection of negative power supply line VCATH and third power supply line 22a can be suppressed as compared to the case where side surface 140 is composed of only an inclined surface.

Figure 13:
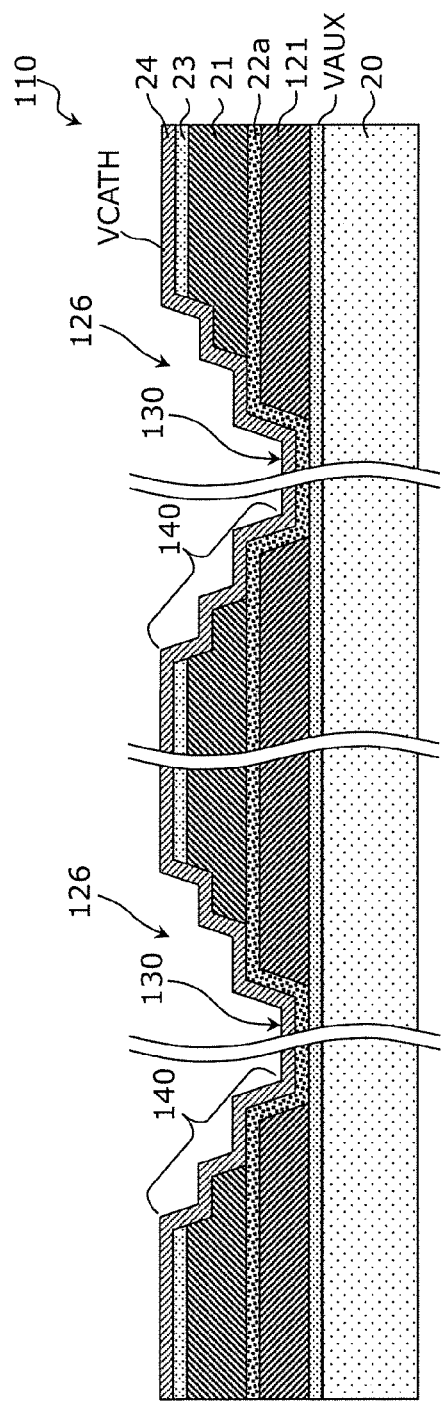
FIG. 13 is a schematic cross-sectional view illustrating an example of the structure in the longitudinal direction of a contact hole formed in a pixel circuit according to the Embodiment 2.

Next, the structure in the longitudinal direction (vertical direction in FIG. 10) of contact hole 126 according to the embodiment will be described with reference to FIGS. 10 and 13. FIG. 13 is a schematic cross-sectional view illustrating an example of the structure in the longitudinal direction of contact hole 126 formed in pixel circuit 110 according to the embodiment. FIG. 13 illustrates a cross section taken along line XIII-XIII in FIG. 10.

As illustrated in FIGS. 10 and 13, one or more contact holes 126 according to the embodiment include a plurality of contact holes 126 that are disposed in a direction intersecting with the opposite two sides of the third subpixel region and are long in the direction. The plurality of contact holes 126 are spaced apart from each other. In the embodiment, as illustrated in FIG. 10, pixel circuit 10 has three contact holes formed disposed in a direction intersecting with the opposite two sides of each of subpixel regions 11R and 11B. Three contact holes 126 have a long shape in the direction intersecting with the opposite two sides of each subpixel region and are spaced apart from each other. In addition, as illustrated in FIG. 13, also in a cross-section along the longitudinal direction of each contact hole 126, at least part of side surface 140 has a step-like cross-sectional shape including one or more flat portions.

Figure 14:
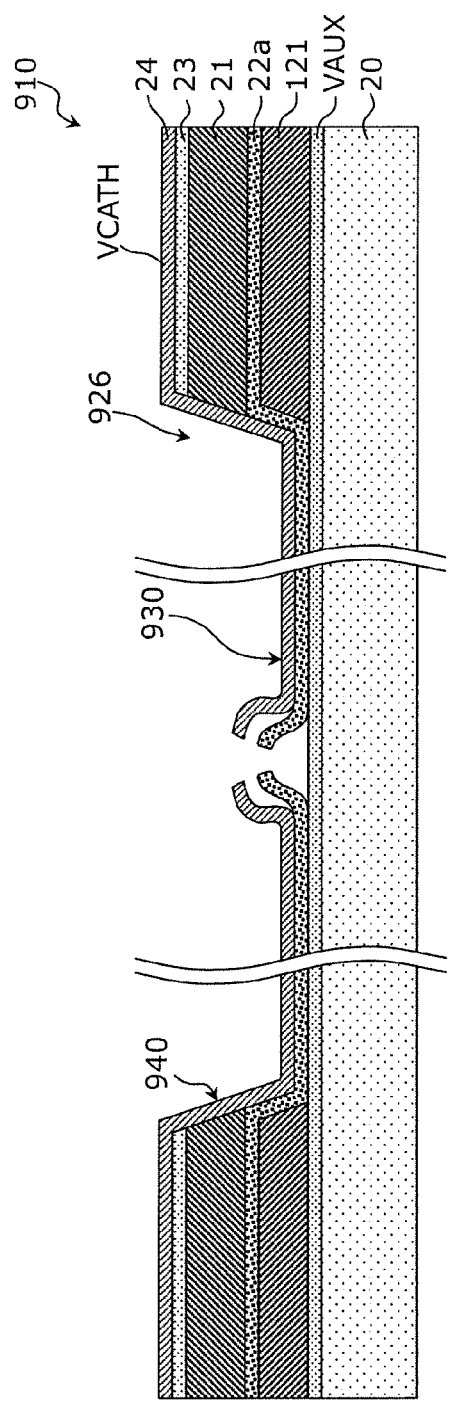
FIG. 14 is a schematic cross-sectional view illustrating the structure of a contact hole formed in a pixel circuit according to comparative example 2.

The effect achieved by including, in pixel circuit 110 according to the embodiment, contact holes 126 that are disposed in the direction intersecting with the opposite two sides of the third subpixel region and long in the direction will be described with reference to FIG. 14 while comparing with a contact hole of comparative example 2. FIG. 14 is a schematic cross-sectional view illustrating the structure of contact hole 926 formed in pixel circuit 910 of comparative example 2. Pixel circuit 910 of comparative example 2 has the same layer configuration as pixel circuit 110 according to the embodiment but differs from pixel circuit 110 according to the embodiment in that contact hole 926 is formed over the entire length between the opposite two sides of the third subpixel region.

As illustrated in FIG. 14, contact hole 926 has bottom surface 930 and side surface 940. In pixel circuit 910 according to comparative example 2, since the length of bottom surface 930 in the longitudinal direction becomes longer, a region where auxiliary power supply line VAUX, third power supply line 22a, and negative power supply line VCATH are in contact with each other becomes longer. Generally, since auxiliary power supply line VAUX and third power supply line 22a are formed of different material from that of negative power supply line VCATH, the thermal expansion coefficient of auxiliary power supply line VAUX and third power supply line 22a is different from that of negative power supply line VCATH. In addition, in pixel circuit 910 of comparative example 2, since a region where third power supply line 22a is in contact with negative power supply line VCATH is longer, stress applied to between these power supply lines becomes larger than that of the case where a region in contact is shorter. Accordingly, as illustrated in FIG. 14, there is a risk of the occurrence of film peeling of third power supply line 22a and negative power supply line VCATH.

On the other hand, in pixel circuit 110 according to the embodiment, one or more contact holes 126 include a plurality of contact holes 126 that are disposed in the direction intersecting with the opposite two sides of the third subpixel region and long in the direction, and the plurality of contact holes 126 are spaced apart from each other. Consequently, a region where third power supply line 22a is in contact with negative power supply line VCATH in each contact hole 126 is shorter than that in contact hole 926 of comparative example 2 so that stress applied to between these power supply lines becomes smaller than that in comparative example 2. Therefore, film peeling of third power supply line 22a and negative power supply line VCATH can be suppressed.

In the embodiment, although negative power supply line VCATH is connected to auxiliary power supply line VAUX via third power supply line 22a, negative power supply line VCATH may be directly connected to auxiliary power supply line VAUX. That is, third power supply line 22a may not be disposed between negative power supply line VCATH and auxiliary power supply line VAUX.

Variations or the Like

Although the pixel circuit and the display device according to each embodiment of the present disclosure have been described above, the present disclosure is not limited to each embodiment. As long as the gist of the present disclosure is kept, configurations in which various modifications conceived by those skilled in the art are applied to the embodiments or forms constructed by combining components in different embodiments may be also included in the scope of one or more aspects of the present disclosure.

For example, gate drivers 13 and 14 may be disposed on both sides of display 12. Gate drivers 13 and 14 may be composed of shift registers in which flip-flop circuits are connected in multiple stages. Gate drivers 13 and 14 may be composed of any transistors of CMOS transistors, N-type channel transistors, and P-type channel transistors.

Display 12 and gate drivers 13 and 14 may be formed on a display panel. Data driver 15 may be formed on the display panel or may be formed on a flexible wiring film that connects the display panel and controller 16.

In above Embodiment 2, side surface 140 of each contact hole 126 has one or more flat portions 142 and 144, but the side surface shape of the contact hole is not limited to this. For example, at least part of the side surface of the contact hole may be greatly inclined with respect to the bottom surface. Such a variation will be described with reference to FIG. 15.

Figure 15:
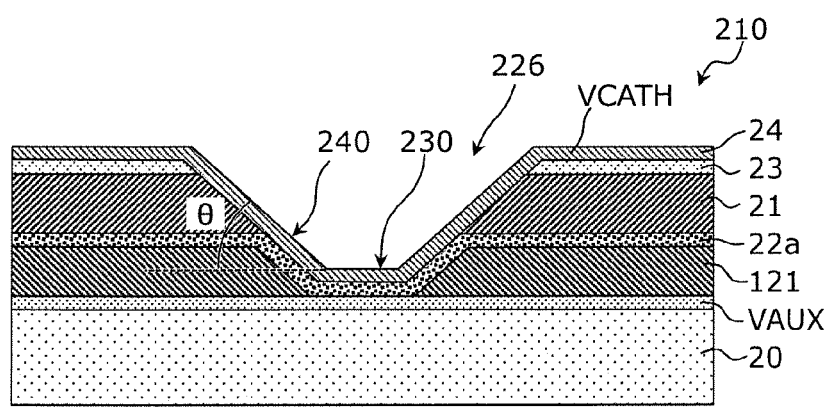
FIG. 15 is a schematic cross-sectional view illustrating an example of the structure of a contact hole formed in a pixel circuit according to a variation.

FIG. 15 is a schematic cross-sectional view illustrating an example of the structure of contact hole 226 formed in pixel circuit 210 according to the variation. Pixel circuit 210 according to the variation has the same layer configuration as pixel circuit 110 according to Embodiment 2 but differs from pixel circuit 110 according to Embodiment 2 in the structure of contact hole 226. As illustrated in FIG. 15, contact hole 226 has bottom surface 230 and side surface 240. Side surface 240 of contact hole 226 is inclined with respect to bottom surface 230 at inclination angle θ of 20 degrees or more and 40 degrees or less. Since this can substantially reduce the aspect ratio of contact hole 226, a region of bottom surface 230 shadowed by the periphery or the like of contact hole 226 can be reduced. Therefore, the film thickness of negative power supply line VCATH (that is, cathode 24) becoming thin or an unformed part occurring within contact hole 226 can be reduced.

(Summary)

In order to achieve the aforementioned object, a pixel circuit according to an aspect disclosed herein is pixel circuit disposed in a pixel region including three subpixel regions, and includes: three light-emitting elements that are disposed in mutually different subpixel regions among the three subpixel regions and have mutually different luminescent colors; one drive circuit that is disposed in a first subpixel region and supplies drive current to the three light-emitting elements in time division, the first subpixel region being any one subpixel region among the three subpixel regions; and at least one first power supply line that is disposed in a second subpixel region and supplies power supply voltage to the one drive circuit, the second subpixel region being at least one subpixel region different from the first subpixel region among the three subpixel regions.

Accordingly, one drive circuit provided for each pixel circuit is used to cause the plurality of light-emitting elements with mutually different luminescent colors to sequentially emit light in time division, and thereby a desired color can be displayed by afterimage effect. Therefore, the drive circuit conventionally disposed for each subpixel circuit is reduced to one for each pixel circuit and disposed only in the first subpixel region, and a layout area density as one pixel can be reduced. As a result, since the first power supply line can be provided wider in the second subpixel region different from the first subpixel region and the resistance of the first power supply line within the pixel circuit can be reduced, the voltage drop in the first power supply line is reduced.

Furthermore, the at least one first power supply line may be provided in contact with opposite two sides of the second subpixel region and occupy at least half of an area of the second subpixel region in plan view.

Accordingly, the resistance of the first power supply line within the pixel circuit can be effectively reduced, and the voltage drop in the first power supply line can be reduced more reliably.

Furthermore, the pixel circuit may further include: a blanket electrode which is disposed over an entirety of the pixel region and connected with the three light-emitting elements, and through which the drive current supplied to the three light-emitting elements flows; and a second power supply line disposed in a third subpixel region and connected with the blanket electrode in the third subpixel region, the third subpixel region being at least one subpixel region different from the first subpixel region among the three subpixel regions.

Accordingly, the effective resistance of the blanket electrode can be reduced to the combined resistance of the blanket electrode and the second power supply line so that the voltage drop in the blanket electrode is reduced.

Furthermore, the second power supply line may be provided in contact with opposite two sides of the third subpixel region and connected with the blanket electrode over an entire length of the second power supply line.

Accordingly, the effective resistance of a blanket electrode within the pixel circuit can be effectively reduced, and the voltage drop in the blanket electrode can be reduced more reliably Furthermore, the second power supply line may be provided in contact with opposite two sides of the third subpixel region and connected with the blanket electrode at one or more contact holes between the opposite two sides of the third subpixel region.

Accordingly, the effective resistance of a blanket electrode within the pixel circuit can be effectively reduced, and the voltage drop in the blanket electrode can be reduced more reliably Furthermore, the one or more contact holes may include a plurality of contact holes that are disposed in a direction intersecting with the opposite two sides of the third subpixel region and are long in the direction, and the plurality of contact holes may be spaced apart from each other.

Accordingly, the region where the second power supply line is in contact with the blanket electrode in each contact hole becomes shorter than that of the case where the contact hole is formed over the entire length between the opposite two sides of the third subpixel region. Consequently, the stress applied to between these power supply lines becomes relatively small. Therefore, film peeling of third power supply line 22a and negative power supply line VCATH can be suppressed.

Furthermore, each of the one or more contact holes may have a bottom surface and a side surface surrounding a periphery of the bottom surface, and at least part of the side surface of at least one of the one or more contact holes may have a step-like cross-sectional shape including one or more flat portions.

Accordingly, the aspect ratio of the contact hole can be substantially reduced so that the region of the bottom surface shadowed by the periphery or the like of the contact hole can be reduced. Therefore, the film thickness of the blanket electrode becoming thin or an unformed part occurring within the contact hole can be reduced.

Furthermore, the pixel circuit may further include: a third power supply line including a same material as the at least one first power supply line. The second power supply line may be connected to the blanket electrode via the third power supply line on the bottom surface, and the blanket electrode may be in contact with the third power supply line in at least one of the one or more flat portions.

By the blanket electrode being in contact with the third power supply line in a step-shape in this way, the aspect ratio of the contact hole can be substantially reduced. Therefore, when the blanket electrode is formed, it becomes easier for metal particles to reach the entirety of the contact hole. Since metal particles are likely to deposit on flat portions when the blanket electrode and the third power supply line are formed, the step disconnection of the blanket electrode and the third power supply line can be suppressed as compared to the case where the side surface is composed of only an inclined surface.

Furthermore, each of the one or more contact holes may have a bottom surface and a side surface surrounding a periphery of the bottom surface, and at least part of the side surface of at least one of the one or more contact holes may be inclined with respect to the bottom surface at an inclination angle of 20 degrees or more and 40 degrees or less.

Accordingly, the aspect ratio of the contact hole can be substantially reduced so that the region of the bottom surface shadowed by the periphery or the like of the contact hole can be reduced. Therefore, the film thickness of the blanket electrode becoming thin or an unformed part occurring within the contact hole can be reduced.

Furthermore, a display device according to an aspect disclosed herein includes: a plurality of pixel circuits which are disposed in a matrix and each of which is the above-described pixel circuit; a column power supply line provided in each of columns of the matrix by connection of first power supply lines of pixel circuits disposed in the column among the plurality of pixel circuits; and a surface electrode which is provided over an entirety of the matrix by connection of blanket electrodes of the plurality of pixel circuits disposed in the matrix.

Accordingly, based on the advantageous effects of the above-described pixel circuit, it is possible to provide a display device in which voltage drop in power supply wiring is reduced.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used as a pixel circuit and a display device in various video display devices such as a portable information terminal, a personal computer, and a television receiver.

The invention claimed is:

1. A pixel circuit disposed in a pixel region including three subpixel regions, the pixel circuit comprising:
   three light-emitting elements that are disposed in mutually different subpixel regions among the three subpixel regions and have mutually different luminescent colors;
   one drive circuit that is disposed in a first subpixel region and supplies drive current to the three light-emitting elements in time division, the first subpixel region being any one subpixel region among the three subpixel regions; and
   at least one first power supply line that is disposed in a second subpixel region and supplies power supply voltage to the one drive circuit, the second subpixel region being at least one subpixel region different from the first subpixel region among the three subpixel regions.

2. The pixel circuit according to claim 1,
   wherein the at least one first power supply line is provided in contact with opposite two sides of the second subpixel region and occupies at least half of an area of the second subpixel region in plan view.

3. The pixel circuit according to claim 1, further comprising:
   a blanket electrode which is disposed over an entirety of the pixel region and connected with the three light-emitting elements, and through which the drive current supplied to the three light-emitting elements flows; and
   a second power supply line disposed in a third subpixel region and connected with the blanket electrode in the third subpixel region, the third subpixel region being at least one subpixel region different from the first subpixel region among the three subpixel regions.

4. The pixel circuit according to claim 3,
   wherein the second power supply line is provided in contact with opposite two sides of the third subpixel region and connected with the blanket electrode over an entire length of the second power supply line.

5. The pixel circuit according to claim 3,
wherein the second power supply line is provided in contact with opposite two sides of the third subpixel region and connected with the blanket electrode at one or more contact holes between the opposite two sides of the third subpixel region.

6. The pixel circuit according to claim 5,
wherein the one or more contact holes include a plurality of contact holes that are disposed in a direction intersecting with the opposite two sides of the third subpixel region and are long in the direction, and
the plurality of contact holes are spaced apart from each other.

7. The pixel circuit according to claim 5,
wherein each of the one or more contact holes has a bottom surface and a side surface surrounding a periphery of the bottom surface, and
at least part of the side surface of at least one of the one or more contact holes has a step-like cross-sectional shape including one or more flat portions.

8. The pixel circuit according to claim 7, further comprising
a third power supply line including a same material as the at least one first power supply line,
wherein the second power supply line is connected to the blanket electrode via the third power supply line on the bottom surface, and
the blanket electrode is in contact with the third power supply line in at least one of the one or more flat portions.

9. The pixel circuit according to claim 5,
wherein each of the one or more contact holes has a bottom surface and a side surface surrounding a periphery of the bottom surface, and
at least part of the side surface of at least one of the one or more contact holes is inclined with respect to the bottom surface at an inclination angle of 20 degrees or more and 40 degrees or less.

10. A display device, comprising:
a plurality of pixel circuits which are disposed in a matrix and each of which is the pixel circuit according to claim 1;
a column power supply line provided in each of columns of the matrix by connection of first power supply lines of pixel circuits disposed in the column among the plurality of pixel circuits; and
a surface electrode which is provided over an entirety of the matrix by connection of blanket electrodes of the plurality of pixel circuits disposed in the matrix.

* * * * *